United States Patent
Haran et al.

(10) Patent No.: US 10,741,668 B2
(45) Date of Patent: Aug. 11, 2020

(54) SHORT CHANNEL AND LONG CHANNEL DEVICES

(71) Applicant: GLOBALFOUNDRIES INC., Grand Cayman (KY)

(72) Inventors: Bala Haran, Watervliet, NY (US);
Ruilong Xie, Niskayuna, NY (US);
Balaji Kannan, Clifton Park, NY (US);
Katsunori Onishi, Somers, NY (US);
Vimal K. Kamineni, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 89 days.

(21) Appl. No.: 15/654,234

(22) Filed: Jul. 19, 2017

(65) Prior Publication Data

US 2019/0027578 A1    Jan. 24, 2019

(51) Int. Cl.

| | |
|---|---|
| *H01L 29/66* | (2006.01) |
| *H01L 21/8234* | (2006.01) |
| *H01L 21/8238* | (2006.01) |
| *H01L 29/161* | (2006.01) |
| *H01L 21/285* | (2006.01) |
| *H01L 29/78* | (2006.01) |
| *H01L 27/092* | (2006.01) |

(52) U.S. Cl.
CPC .. *H01L 29/66545* (2013.01); *H01L 21/28506* (2013.01); *H01L 21/823431* (2013.01); *H01L 21/823456* (2013.01); *H01L 21/823842* (2013.01); *H01L 29/161* (2013.01); *H01L 29/6656* (2013.01); *H01L 29/66613* (2013.01); *H01L 21/82345* (2013.01); *H01L 21/823821* (2013.01); *H01L 27/0924* (2013.01); *H01L 29/785* (2013.01)

(58) Field of Classification Search
CPC ......... H01L 29/66606; H01L 29/66871; H01L 29/66545; H01L 27/0924; H01L 21/823821; H01L 21/82385; H01L 21/823842; H01L 21/823456; H01L 29/42372; H01L 29/4236; H01L 21/823431; H01L 21/28506; H01L 29/161; H01L 29/66613; H01L 29/6656; H01L 29/785; H01L 21/82345
See application file for complete search history.

(56) References Cited

U.S. PATENT DOCUMENTS

| | | |
|---|---|---|
| 9,257,348 B2 | 2/2016 | Xie et al. |
| 2011/0147831 A1 | 6/2011 | Steigerwald et al. |
| 2015/0145057 A1* | 5/2015 | Fan ................ H01L 27/092 257/369 |

(Continued)

FOREIGN PATENT DOCUMENTS

WO    2015047731    4/2015

*Primary Examiner* — Nelson Garces
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to replacement metal gate structures and methods of manufacture. The structure includes at least one short channel device including a dielectric material, a workfunction metal, and a capping material, and a long channel device comprising the dielectric material, the workfunction metal and fluorine free gate conductor material.

18 Claims, 6 Drawing Sheets

(56) References Cited

U.S. PATENT DOCUMENTS

2017/0194209 A1\* 7/2017 Li .................. H01L 27/088
2017/0236821 A1\* 8/2017 Kim ................ H01L 29/7854
                                                   257/401

\* cited by examiner

NFET    PFET

NFET: Long Channel Device

NFET: Long Channel Device

NFET: Long Channel Device

SHORT CHANNEL AND LONG CHANNEL DEVICES

FIELD OF THE INVENTION

The present disclosure relates to semiconductor structures and, more particularly, to replacement metal gate structures and methods of manufacture.

BACKGROUND

Transistors such as nFET and pFET devices can be fabricated in a gate first process or gate last process. The gate last process is also known as "replacement metal gate" techniques. The replacement metal gate technique can be used when forming planar devices or 3D devices, e.g., FinFETs.

In replacement metal gate techniques, the nFET and pFET devices include several sacrificial layers which are removed to define a gate cavity where a replacement gate structure will subsequently be formed. Various layers of material that will constitute the replacement gate structure are formed in the gate cavity, with nFET and pFET devices having a different number of materials. As is understood by those of ordinary skill in the art, a nFET device typically has a greater number of materials than the pFET device. By way of example, for an nFET device, the following materials may can be used to fill the cavity: a high-k gate insulation layer, a first metal layer (e.g., a layer of titanium nitride), a second metal layer, (e.g., workfunction metal), a third metal layer (e.g., a layer of titanium nitride) and a bulk metal layer, such as aluminum or tungsten. This is compared to a pFET device which typically requires a high-k gate insulation layer, a single layer of titanium nitride, e.g., workfunction metal, and the bulk metal layer.

As the gate length of transistor devices decreases, the physical size of the gate cavity also decreases. For this reason, it is becoming physically difficult to fit all of the needed layers of material in the cavity for the replacement gate structure, particularly for nFET devices which require more layers than the pFET device. Also, as the devices scale downward, the fabrication processing are becoming more difficult.

For example, as gate lengths continue to decrease, voids or seams may be formed as the various layers of material are deposited into the gate cavity. Such voids or seams may result in devices that perform at levels less than anticipated or, in some cases, the formation of devices that are simply not acceptable and have to be discarded. Also, the reduced-size gate cavity makes it more difficult to scale the workfunction metal in the nFET devices, with tungsten. In addition, the presence of fluorine in the tungsten chemical vapor (CVD) deposition chemistry (e.g., $WF_6$) can impact the nFET Vt and adversely impact nFET workfunction scaling. It has also become more difficult to control the workfunction metal (WFM) recess process, as little space is available for both n-type workfunction metal and barrier TiN deposition, followed by SOH (spin on hardmask) during the recess process. Accordingly, it becomes a challenge to fill the narrow gate, e.g., smaller cavity, with organic planarizing layer (OPL).

SUMMARY

In an aspect of the disclosure, a structure comprises: at least one short channel device comprising a dielectric material, a workfunction metal, and a capping material; and a long channel device comprising the dielectric material, the workfunction metal and fluorine free gate conductor material.

In an aspect of the disclosure, a structure comprises: a first structure comprising a gate dielectric material, a first workfunction metal and a capping material; a second structure comprising the gate dielectric material, the first workfunction metal, a second workfunction metal and the capping material; and a third structure comprising the gate dielectric material, the first workfunction metal and a cobalt gate conductor.

In an aspect of the disclosure, a method comprises: protecting a long channel device with a mask; selectively removing cobalt material from the short channel device, while protecting the cobalt material in the long channel device with the mask; and filling a cavity of the short channel device and spaces of the long channel device with a capping material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to replacement metal gate structures and methods of manufacture. More specifically, the present disclosure relates to replacement metal gate structures with integration of cobalt for 7 nm and beyond devices. Advantageously, the present disclosure provides improved fabrication processes and device performance for replacement gate structures.

By way of example, in embodiments, after pFET patterning and workfunction metal recess (e.g., p-type workfunction recess), a metal, e.g., TiN, is deposited with a cobalt fill process, followed by a planarization process, e.g., chemical mechanical polishing (CMP). A recess of the workfunction metal, selective to the cobalt, is then performed on the structure, e.g., long channel and short channel devices. The long channel devices can be masked with cobalt being removed in the short channel devices. In this process, there is no need to control the cobalt recess depth uniformity since all of the cobalt is being removed therefrom. The short channel devices are then capped with a cap material.

The replacement metal gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the replacement metal gate structures of the present disclosure have been adopted from integrated circuit (IC) technology. For example, the structures are built on wafers and are realized in films of material patterned by photolithographic processes on the top of a wafer. In particular, the fabrication of the replacement metal gate structures uses three basic building blocks: (i) deposition of thin films of material on a substrate, (ii) applying a patterned mask on top of the films by photolithographic imaging, and (iii) etching the films selectively to the mask.

Figure 1:
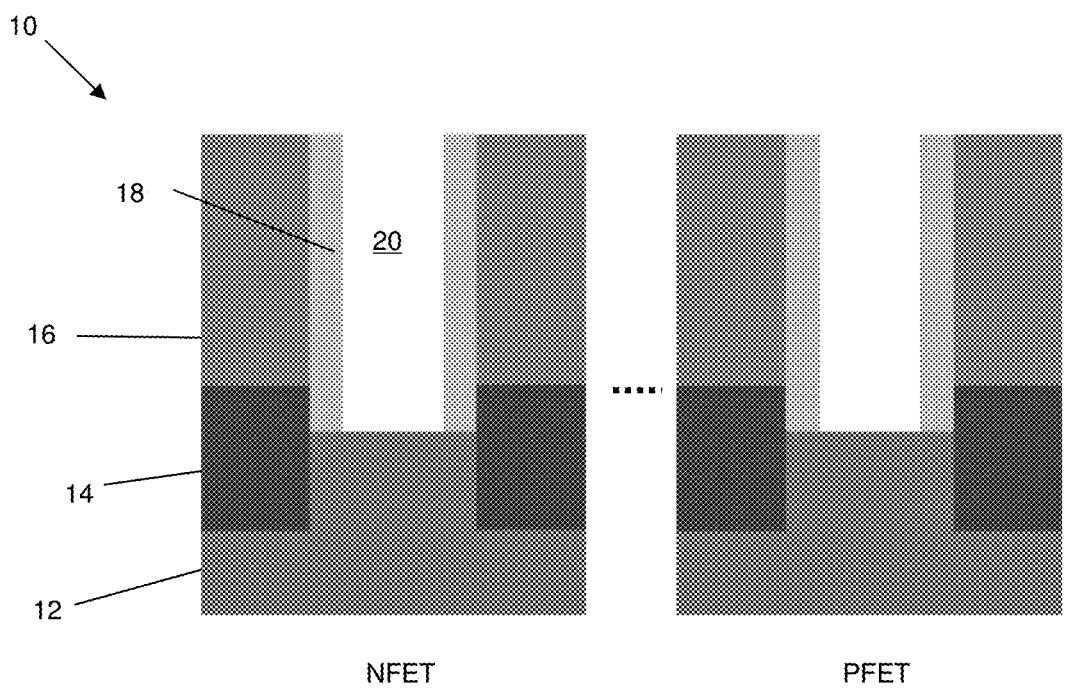
FIG. 1 shows a fin structure, amongst other features, and respective fabrication processes in accordance with aspects of the present disclosure.

FIG. 1 shows a fin structure, amongst other features, and respective fabrication processes in accordance with aspects of the present disclosure. More specifically, FIG. 1 shows a structure 10 comprising a fin structure 12 for both an nFET device and a pFET device. In embodiments, the fin structure 12 can be composed of any suitable semiconductor material. For example, the semiconductor material can include, but not limited to, Si, SiGe, SiGeC, SiC, GaAs, InAs, InP, and other III/V or II/VI compound semiconductors.

The fin structure 12 can be formed by sidewall image transfer (SIT) techniques. In an example of a SIT technique, a mandrel material, e.g., $SiO_2$, is deposited on the semiconductor material using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 12. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures can also be formed during this or other patterning processes, or through other conventional patterning processes, as contemplated by the present disclosure.

Still referring to FIG. 1, source and drain regions 14 are formed on the fin structures 12, which will be positioned on opposing sides of a gate structure. The source and drain regions 14 can be raised source and drain regions formed by an epitaxial growth process. The raised source and drain regions 14 can be doped by ion implantation processes or other conventional diffusion processes. An insulator material 16 is formed over the source and drain regions 14 and fin structures 12 using conventional deposition methods. For example, the insulator material can be deposited by a conventional chemical vapor deposition (CVD) process. The insulator material 16 can be any low-k dielectric material such as, e.g., oxide.

A cavity 20 is formed in the insulator material 16 using conventional dummy gate processes. Specifically, the cavity 20 is formed from dummy gate patterned via direct lithography patterning or sidewall image transfer. These dummy "poly gates" comprise a poly-silicon/nitride stack, formed prior to source/drain implantation processes. Then, spacer materials 18, e.g., nitride, are deposited on the dummy gates and are etched anisotropically to expose the silicon (or other underlying semiconductor material). Then epitaxial films are deposited on n/p polarities with a block. After source/drain formation as described above, a set of steps referred to as poly-open CMP (POC), are performed to expose the poly-Si which is then etched in a poly-pull process. This leaves the cavity 20 for the replacement metal gate. This method of removing poly-silicon and forming gates is called RMG (replacement metal gate) for gate last technology.

Figure 2:
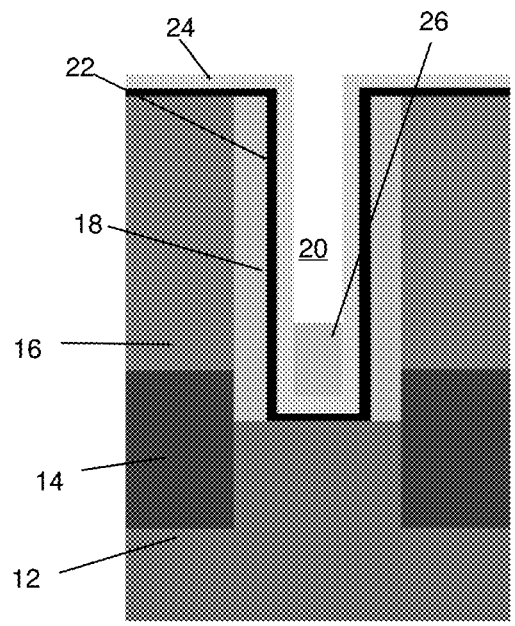
FIG. 2 shows a gate dielectric material and the liner material in cavities, amongst other features, and respective fabrication processes in accordance with aspects of the present disclosure.

Referring to FIG. 2, for both an nFET device and a pFET device, a high-k dielectric material 22 is formed on the liner material 18, remaining exposed surfaces of the insulator layer 16 and exposed fin surface 12. In embodiments, the high-k dielectric material 22 can be deposited by a conventional deposition process, e.g., atomic layer deposition (ALD), to a thickness of about 1 nm to about 3 nm; although other dimensions are contemplated herein, depending on the dimensions of the cavity 20. In embodiments, the high-k dielectric material 22 can be a gate dielectric material composed of the following materials, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 2, a p-type workfunction metal 24 is deposited on the high-k dielectric material 22. The p-type workfunction metal 24 can be, e.g., TiN, deposited using a conventional deposition method, e.g., ALD, to a thickness of about 1 nm to about 4 nm. Again, it should be understood by those of skill in the art that other dimensions of the p-type workfunction metal 24 can be deposited, depending on the dimensions of the cavity 20.

SOH or other organic planarizing material 26 can be deposited within the cavities 20, on the p-type workfunction metal 24. In embodiments, the SOH or other organic planarizing material 26 can be deposited over the pFETs and nFETs and etched back or recessed in the cavity 20 leading to a height of about 2 nm to about 25 nm over the pFET side of the device, while blocking the material on the nFET side of the device in certain implementations.

Figure 3:
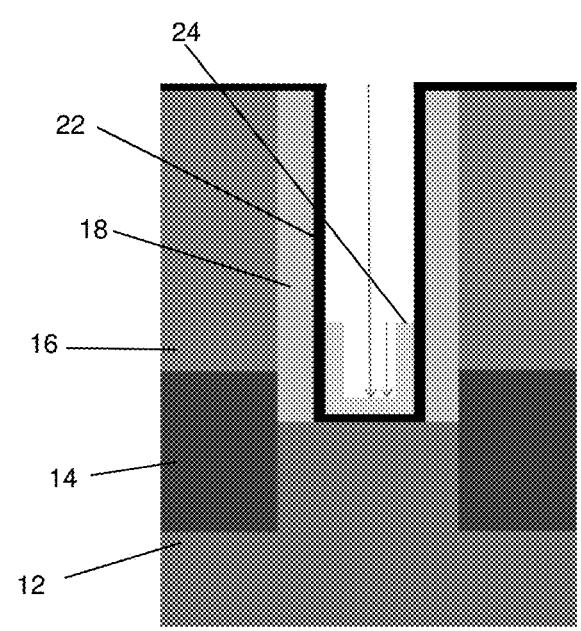
FIG. 3 shows p-type workfunction metal partially removed or recessed within cavities, amongst other features, and respective fabrication processes in accordance with aspects of the present disclosure.

In FIG. 3, the p-type workfunction metal 24 will be partially removed or recessed within the cavities 20 selective to SOH. In embodiments, the p-type workfunction metal 24 can be recessed by a wet etch process known to those of skill in the art, e.g., standard SC1 or SC2 etch processes. During the partial removal (recessing) of the p-type workfunction metal 24, the SOH or other organic planarizing material 26 will protect the p-type workfunction metal 24 at the bottom of the cavity 20, e.g., leaving a height of about 2 nm to about 25 nm. The SOH or other organic planarizing material 26 can be removed by a dry etch process, e.g., RIE, with a chemistry than can selectively etch the material of the SOH or other organic planarizing material 26.

Figure 4:
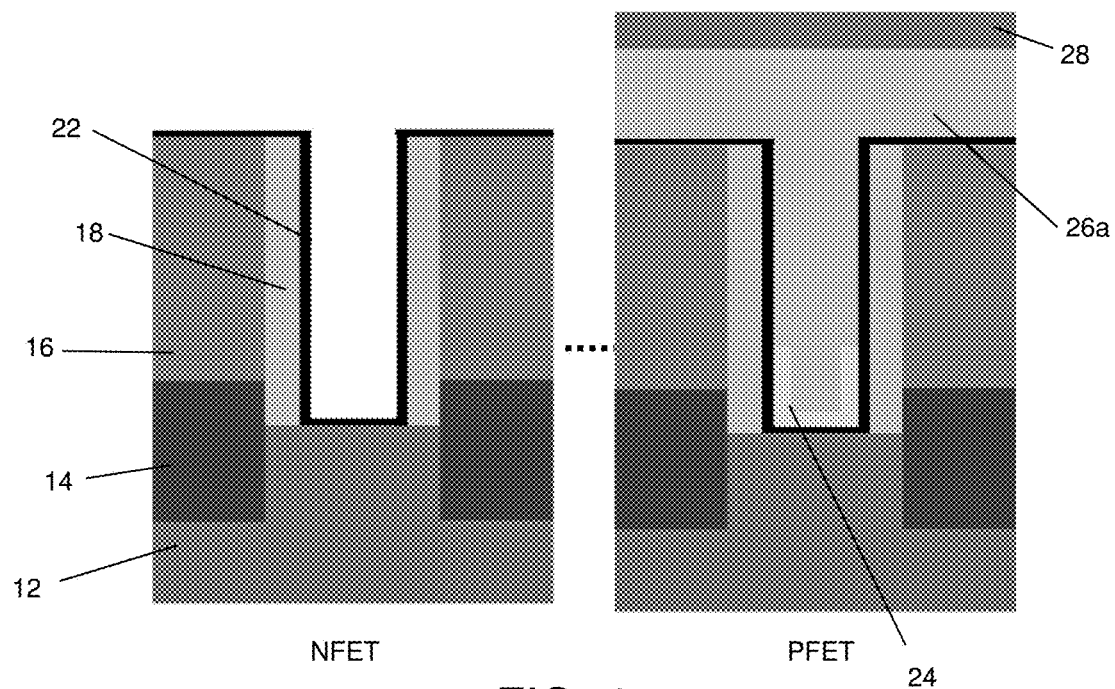
FIG. 4 shows the p-type workfunction metal removed from the cavity on an nFET side of the structure, amongst other features, and respective fabrication processes in accordance with aspects of the present disclosure.

Referring to FIG. 4, the p-type workfunction metal 24 can be removed from the cavity 20 on an nFET side of the structure. More specifically, in embodiments, a SOH or other organic planarizing material 26a and a resist 28 can be deposited on the structure. In embodiments, the resist can be, e.g., SiARC, TiARC or low thermal oxide (LTO) material. After forming an opening in the resist on the nFET side of the structure, e.g., using conventional lithography processes, the SOH or other organic planarizing material 26a can be removed from the cavity 20 on the nFET side of the device, followed by removal of the p-type workfunction metal 24. In embodiments, the p-type workfunction metal 24 can be removed by a wet etch process as is known to those of skill in the art. As should be understood by those of skill in the art, the p-type workfunction metal 24 on the pFET side of the structure will remain protected by the SOH or other organic planarizing material 26a. Following the removal of the p-type workfunction metal 24 on the nFET side of the structure, the resist 28 and SOH or other organic planarizing material 26a can be removed using conventional etching and stripping processes. The high-k dielectric material 22 will continue to line the cavities 20 for both the nFET device and the pFET device.

Figure 5:
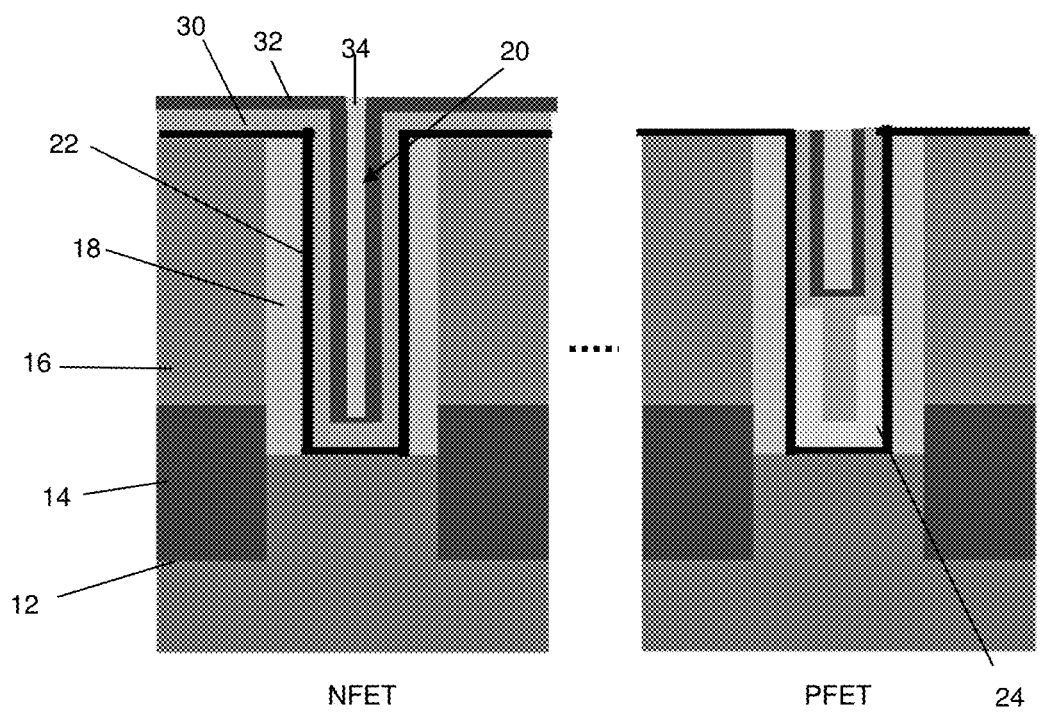
FIG. 5 shows filled cavities on the nFET side and the pFET side of the structure, amongst other features, and respective fabrication processes in accordance with aspects of the present disclosure.

As further shown in FIG. 5, for both the nFET side and the pFET side, a n-type workfunction metal 30 is deposited in the cavities 20 for both the nFET device and the pFET device. In embodiments, the n-type workfunction metal 30 will be deposited directly on the high-k dielectric material 22, on the nFET side of the structure. The n-type workfunction metal 30 can be deposited using conventional deposition methods, e.g., ALD, to a thickness of about 1 nm to about 5 nm.

Still referring to FIG. 5, an optional layer of metal 32, e.g., TiN, is deposited on the n-type workfunction metal 30 in both cavities 20 of the nFET side and the pFET side of the structure. In embodiments, the metal layer 32 can be deposited by a conventional deposition processes to a thickness of about 4 nm, as an example. A fluorine free metal material 34, e.g., cobalt material is deposited in the remaining portions of the cavities 20 as a gate conductor. In embodiments, the cobalt material 34 can be deposited in a fluorine free deposition process, thereby allowing the n-type workfunction metal 30 to be thinner, e.g., about 1 nm to about 5 nm, compared to the process of record, e.g., conventional structures. The structure can be subjected to a conventional CMP process stopping on either a top of the metal layer 32 or the high-k dielectric material 22, as shown representatively by the different layers on the nFET side and the pFET side of the structure.

Figure 6:
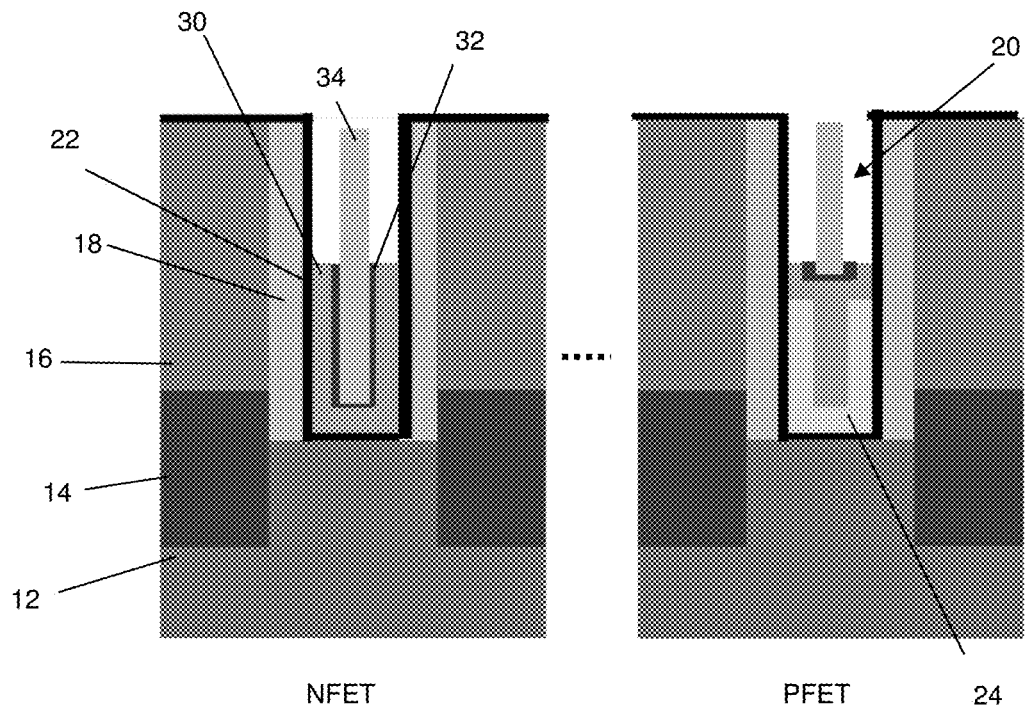
FIG. 6 shows recessing of material within the cavities, amongst other features, and respective fabrication processes in accordance with aspects of the present disclosure.

As shown in FIG. 6, for both the nFET side and the pFET side, the optional layer of metal 32, e.g., TiN, and the n-type workfunction metal 30 can be recessed using a wet etching process with a chemistry selective to the high-k dielectric material 22 and the cobalt material 34, e.g., gate conductor. In embodiments, the optional layer of metal 32, e.g., TiN, and the n-type workfunction metal 30 can be recessed in both cavities 20 to a height of about 4 nm to about 29 nm, as measured from a bottom the cavity, depending on the dimensions of the cavity. In preferred embodiments, the height of the optional layer of metal 32, e.g., TiN, and the n-type workfunction metal 30 in the cavity 20 on the nFET side of the structure can be slightly higher than that on the pFET side of the structure.

Figure 7A:
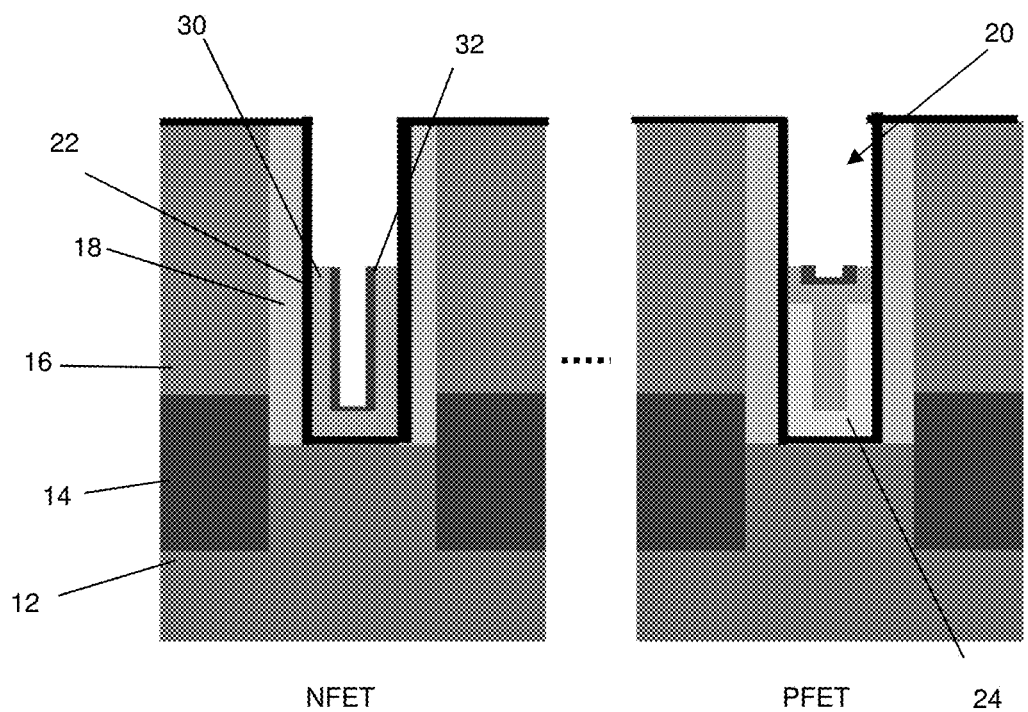
FIGS. 7A and 7B show additional structures and respective fabrication processes in accordance with aspects of the present disclosure.
Figure 7B:
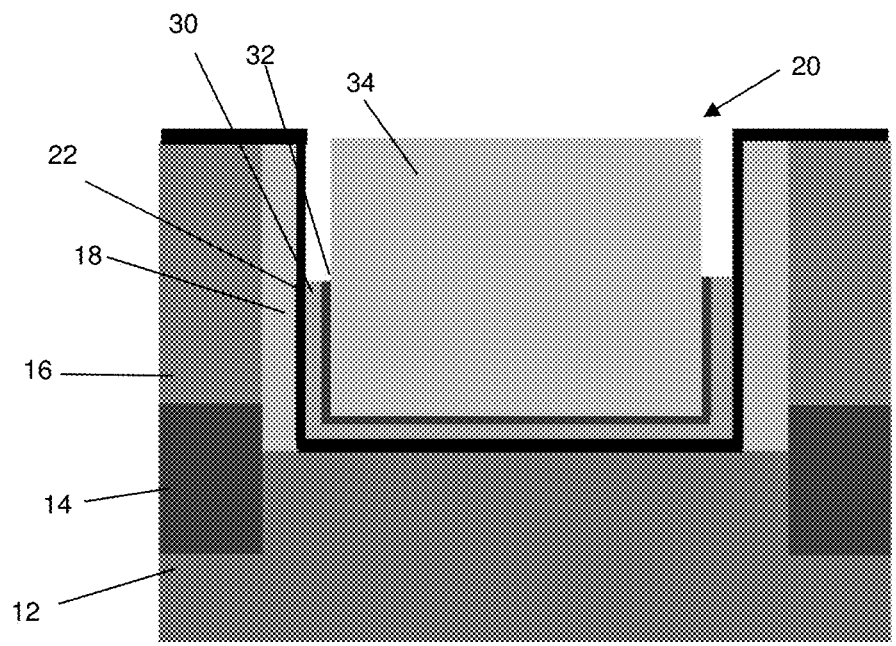

FIGS. 7A and 7B show additional structures and respective fabrication processes in accordance with aspects of the present disclosure. FIG. 7A shows a cross-sectional view of the nFET side and pFET side, along short channel devices; whereas, FIG. 7B shows a cross-sectional view of a representative nFET side, along a long channel device. Although the present disclosure describes the nFET device as being a long channel device, it should be recognized by those of skill in the art that the long channel device and the short channel devices can be either nFET devices or pFET devices.

As shown in FIGS. 7A and 7B, the cobalt material 34, e.g., gate conductor, can be removed from the short channel devices, while being protected in the long channel devices. For example, a single mask can be introduced over the cobalt material 34 of the long channel device shown in FIG. 7B, while the unprotected cobalt material 34 can be removed on the short channel devices. In embodiments, the cobalt material 34 can be removed by a wet etching process with a chemistry selective to the cobalt material 34. In this way, the wet etching process will not attach the n-type workfunction metal 30 or the high-k dielectric material 22 of the short channel devices shown in FIG. 7A. In alternative embodiments, by using a timed wet etch process, the cobalt material 34 can be recessed to a height of approximately the n-type workfunction metal 30 (see, e.g., FIGS. 9 and 10).

Figure 8A:
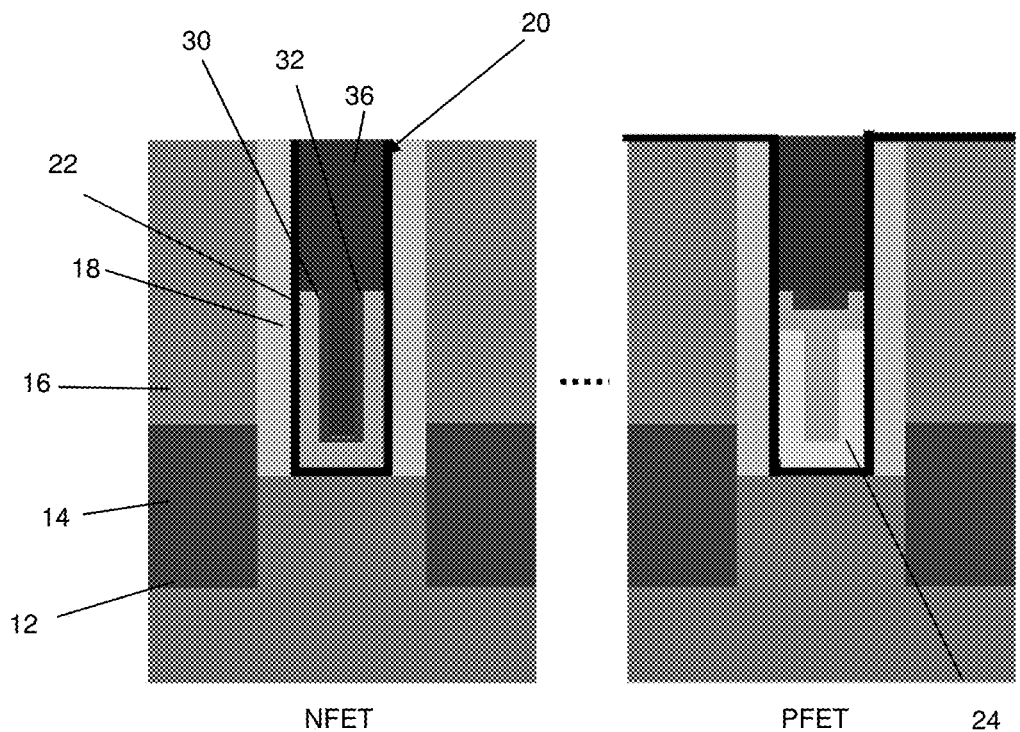
FIGS. 8A and 8B show additional structures and respective fabrication processes in accordance with aspects of the present disclosure.
Figure 8B:
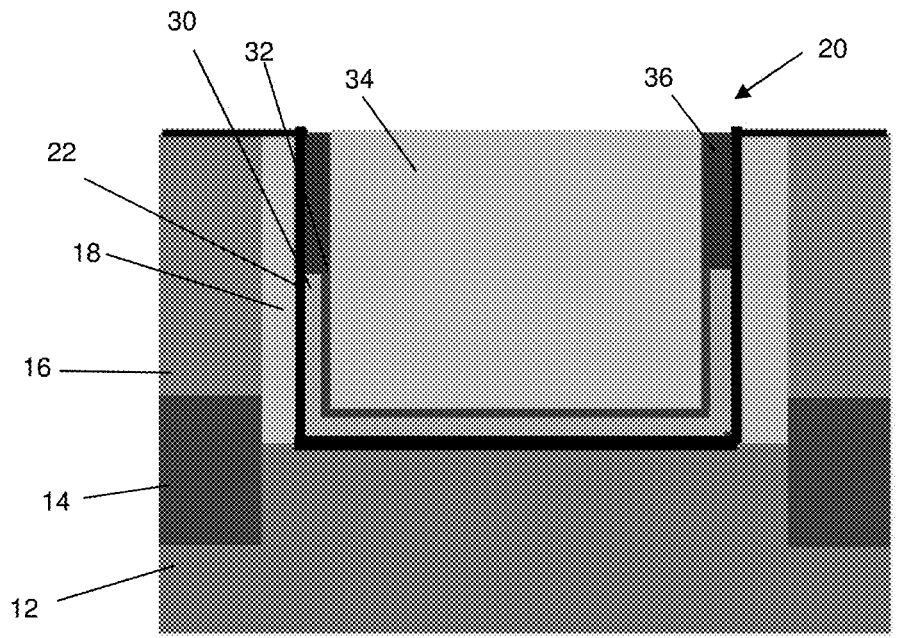

FIGS. 8A and 8B show additional structures and respective fabrication processes in accordance with aspects of the present disclosure. FIG. 8A shows a cross-sectional view of the nFET side and pFET side, along short channel devices; whereas, FIG. 8B shows a cross-sectional view of a representative nFET side, along a long channel device. As shown in these representative figures, a cap layer 36 is formed within the cavities 20. In embodiments, the cap layer 36 can be, e.g., SiN, deposited using a conventional CVD process. As shown in FIG. 8B, for example, the SiN material will be formed within the space formed by recessing of the layer of metal 32, e.g., TiN, and the n-type workfunction metal 30; that is, in the long channel device, the cap layer 36 will be formed between the high-k dielectric material 22 and the cobalt material 34. Following the deposition of the cap layer 36, a conventional CMP process can be used to planarize the structure to a surface of the high-k dielectric material 22, as an example as shown on the pFET side of the structure, or to the insulator material 16 as shown on the nFET side of the structure.

Figure 9:
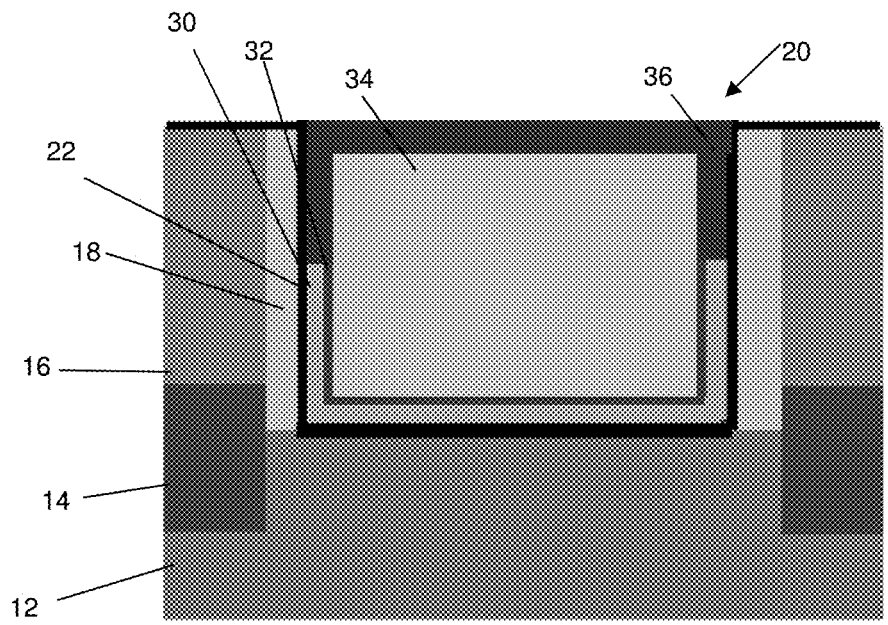
FIG. 9 shows an alternative structure with a gate conductor material slightly recessed for a long channel device and respective fabrication processes in accordance with aspects of the present disclosure.

FIG. 9 shows an alternative structure and respective fabrication processes in accordance with aspects of the present disclosure. As shown in FIG. 9, for example, the cobalt material 34 can be slightly recessed for the long channel device. The cap layer 36 can then be formed on the top surface of the cobalt material 34, formed by the recessing of the cobalt material. Following the deposition of the cap layer 36, a conventional CMP process can be used to planarize the structure to a surface of the high-k dielectric material 22, as an example.

Figure 10:
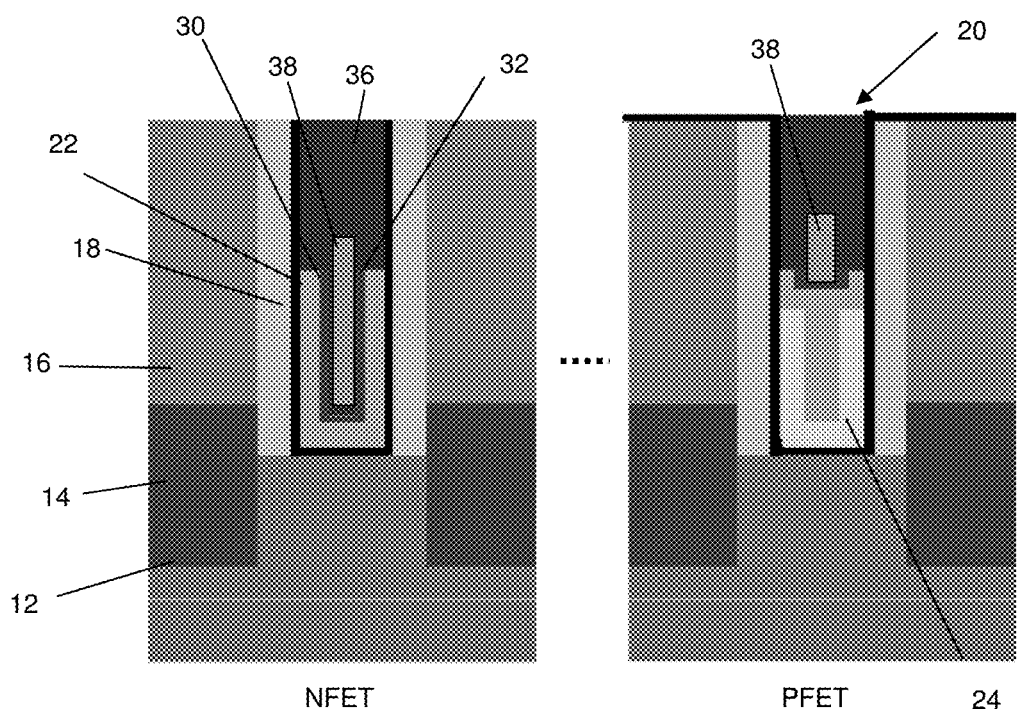
FIG. 10 shows an alternative structure with a gate conductor material slightly recessed for short channel devices and a capping material thereon, and respective fabrication processes in accordance with aspects of the present disclosure.

FIG. 10 shows an alternative structure and respective fabrication processes in accordance with aspects of the present disclosure. In particular, in these embodiments, the cobalt 34 is slightly recessed in the short channel devices.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one short channel device provided within a first cavity and comprising:
     a gate dielectric material which completely lines sidewalls and a bottom surface of the first cavity;
     a workfunction metal directly contacting the gate dielectric material;
     a metal material directly contacting the workfunction metal; and
     a capping material over and in direct contact with the gate dielectric material on the sidewalls of the first cavity, the workfunction metal and the metal material; and
   a long channel device provided in a second cavity and comprising:
     the gate dielectric material which is completely lining sidewalls and a bottom surface of the second cavity;
     the workfunction metal which is directly contacting the gate dielectric material along a lower portion of the sidewalls of the second cavity;
   the metal material which is directly contacting the workfunction metal in the second cavity;
     cobalt gate conductor material which is directly contacting the metal material which is between and in direct contact with both the workfunction metal and the cobalt gate conductor material; and
     the capping material which is above the workfunction metal and which is directly contacting the dielectric material along an upper portion of the sidewalls of the second cavity, wherein
   the at least one short channel device and the long channel device each include a high-k gate dielectric material lining a side of the workfunction metal and the capping material of the at least one short channel device, and
   the at least one short channel device is a nFET device and a pFET device.

2. The structure of claim 1, wherein the capping material is directly in contact with the metal material that is within a trench formed by a U-shape of the workfunction metal.

3. The structure of claim 2, wherein the at least one short channel device which is a pFET device comprises recessed p-type workfunction material directly on the gate dielectric material and n-type workfunction metal directly on the p-type workfunction material.

4. The structure of claim 1, wherein the capping material is SiN.

5. The structure of claim 1, wherein the cobalt in the long channel devices is recessed and the capping material is on the cobalt.

6. The structure of claim 1, wherein the workfunction metal is an n-type workfunction metal having a thickness of about 1 nm to about 5 nm.

7. The structure of claim 6, wherein the metal material is directly contacting the n-type workfunction and is below the capping material, with the capping material is directly contacting the metal material.

8. The structure of claim 1, wherein the short channel devices include recessed cobalt material.

9. The structure of claim 8, wherein the capping material is between the recessed cobalt material and the workfunction metal.

10. The structure of claim 1, wherein the gate dielectric material is a high-k dielectric material which completely lines a sidewall surface of the least one short channel device including the workfunction metal and the capping material.

11. A structure, comprising:
    a first short channel device comprising a high-k gate dielectric material, a first workfunction metal and a capping material;
    a second short channel device comprising the high-k gate dielectric material, the first workfunction metal, a second workfunction metal and the capping material; and
    a third structure comprising the high-k gate dielectric material, the first workfunction metal and a cobalt gate conductor,
    wherein:
    the first short channel device is devoid of the second workfunction metal;
    the first short channel device is an nFET device, the second short channel device is a pFET device and the third structure is a long channel device;
    the short channel devices comprise a metal material between the capping material and the first workfunction metal;
    the long channel device comprises the metal material between the first workfunction metal and the cobalt gate conductor; and
    the short channel devices and the long channel device each include the high-k gate dielectric material lining a side of the first workfunction metal and the capping material.

12. The structure of claim 11, wherein the cobalt in the long channel device is recessed and the capping material is on the cobalt.

13. The structure of claim 11, wherein the second workfunction metal is a recessed p-type workfunction material directly on the gate dielectric material and the first workfunction metal is directly on the p-type workfunction material.

14. The structure of claim 13, wherein the first workfunction metal is an n-type workfunction metal having a thickness of about 1 nm to about 5 nm.

15. The structure of claim 11, wherein the short channel devices include recessed cobalt material and the capping material is between the recessed cobalt material and the first workfunction metal.

16. A structure, comprising:
    at least one short channel device comprising a gate dielectric material along its entire sidewall, a workfunction metal, and a capping material; and a long channel device comprising the gate dielectric material along its entire sidewall, the workfunction metal, fluorine free gate conductor material and a capping material within a space between the gate dielectric material and the fluorine free gate conductor material, the space being formed by a recess of a metal material directly contacting the workfunction metal and the workfunction metal, itself, both of which are between the fluorine free gate conductor material and the gate dielectric material, wherein the gate dielectric material is directly on a side surface of the workfunction metal and directly on a side surface of the capping material in both the at least one short channel device and the long channel device.

17. The structure of claim 1, wherein, for the log channel device, the capping material is provided within a space between the gate dielectric material and the cobalt gate conductor material, the space above the metal material directly contacting the workfunction metal and the workfunction metal, itself.

18. The structure of claim 17, wherein, for the log long channel device, the capping material is planar with a surface of the gate dielectric material.

* * * * *

UNITED STATES PATENT AND TRADEMARK OFFICE
CERTIFICATE OF CORRECTION

PATENT NO. : 10,741,668 B2
APPLICATION NO. : 15/654234
DATED : August 11, 2020
INVENTOR(S) : Haran et al.

Page 1 of 1

It is certified that error appears in the above-identified patent and that said Letters Patent is hereby corrected as shown below:

In the Claims

In Claim 18, Line 21 at Column 9, delete "log".

Signed and Sealed this
Third Day of November, 2020

Andrei Iancu
*Director of the United States Patent and Trademark Office*